(12) United States Patent
Tokiwa

(10) Patent No.: US 7,835,174 B2
(45) Date of Patent: Nov. 16, 2010

(54) NON-VOLATILE MEMORY DEVICE AND METHOD OF READING DATA THEREFROM

(75) Inventor: Naoya Tokiwa, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 190 days.

(21) Appl. No.: 12/266,884

(22) Filed: Nov. 7, 2008

(65) Prior Publication Data

US 2009/0122592 A1 May 14, 2009

(30) Foreign Application Priority Data

Nov. 9, 2007 (JP) .............................. 2007-291784

(51) Int. Cl.
*G11C 11/00* (2006.01)
(52) U.S. Cl. .................. 365/148; 365/189.04; 365/100; 365/230.06; 365/175; 365/115
(58) Field of Classification Search ................. 365/148, 365/189.04, 100, 46, 203, 230.06, 189.14, 365/189.15, 175, 115
See application file for complete search history.

(56) References Cited

U.S. PATENT DOCUMENTS

| 6,839,269 | B2 | 1/2005 | Iwata et al. |
| 2006/0023497 | A1 | 2/2006 | Kawazoe et al. |
| 2007/0091665 | A1 | 4/2007 | Oh et al. |
| 2007/0211544 | A1* | 9/2007 | Takemura ............... 365/189.08 |

FOREIGN PATENT DOCUMENTS

JP    2006-66052    3/2006

OTHER PUBLICATIONS

U.S. Appl. No. 12/123,827, filed May 20, 2008, Takuya Futatsuyama, et al.
U.S. Appl. No. 12/118,064, filed May 9, 2008, Toshiaki Edahiro, et al.
U.S. Appl. No. 12/132,972, filed Jun. 4, 2008, Naoya Tokiwa, et al.
Y. Hosoi, et al., "High Speed Unipolar Switching Resistance RAM (RRAM) Technology", IEEE International Electron Device meeting, Tech. digest, 2006, 4 pages.

* cited by examiner

*Primary Examiner*—Thong Q Le
(74) *Attorney, Agent, or Firm*—Oblon, Spivak, McClelland, Maier & Neustadt, L.L.P.

(57) ABSTRACT

The present invention provides a method of reading data from a non-volatile memory device including word lines and bit lines that intersect each other and electrically rewritable memory cells that are arranged at intersections of the word lines and the bit lines and that respectively have variable resistive elements nonvolatily storing a resistances as data. The method includes: precharging a selected word line and unselected word lines to a first word line voltage and a selected bit line and unselected bit lines to a first bit line voltage; and reading data from a memory cell connected to the selected word line and the selected bit line by changing the voltage of the selected word line from the first word line voltage to a second word line voltage and changing the voltage of the selected bit line from the first bit line voltage to a second bit line voltage after the precharging.

20 Claims, 11 Drawing Sheets

APPLICATION EXAMPLES OF MATERIALS a, b, AND c

|  | EXAMPLE 1 | EXAMPLE 2 |
|---|---|---|
| MATERIAL a | p-TYPE Si | METAL MATERIAL |
| MATERIAL b | INTRINSIC Si | INSULATING FILM |
| MATERIAL c | n-TYPE Si | METAL MATERIAL |

US 7,835,174 B2

NON-VOLATILE MEMORY DEVICE AND METHOD OF READING DATA THEREFROM

CROSS-REFERENCE TO RELATED APPLICATIONS

This application is based upon and claims the benefit of priority from the prior Japanese Patent Application No. 2007-291784, filed on Nov. 9, 2007, the entire contents of which are incorporated herein by reference.

BACKGROUND OF THE INVENTION

1. Field of the Invention

The present invention relates to a memory device including electrically rewritable non-volatile memory cells, and more particularly, to a non-volatile memory device, in which a variable resistive element is used as a memory element to store the resistance thereof as data, and a method of reading the data from the non-volatile memory device.

2. Description of the Related Art

A resistive random access memory (ReRAM) that non-volatily stores resistance information of an electrically rewritable variable resistive element has been known as a nonvolatile memory device. A memory cell of the ReRAM includes a variable resistive element having a recording layer made of a transition metal oxide. The relationship between the voltage of a column selecting line and the voltage of a row selecting line when storing status is read is disclosed in JP-A-2006-66052, for example.

It is preferable to arrange memory cells at the intersections of the column selecting lines and the row selecting lines in order to manufacture a high-density ReRAM at low manufacturing cost. In view of easy operation, a memory cell, in which a diode element is connected in series to a variable resistive element, has been used (refer to a nonpatent literature: Y. Hosoi et al., "High Speed Unipolar Switching Resistance RAM (RRAM) Technology", IEEE International Electron Devices Meeting 2006 Technical Digest, pp. 793-796, for example).

SUMMARY OF THE INVENTION

According to one aspect of the present invention, there is provided a method of reading data from a non-volatile memory device including word lines and bit lines that intersect each other and electrically rewritable memory cells that are arranged at intersections of the word lines and the bit lines and that respectively have variable resistive elements non-volatily storing resistances as data, the method including: precharging a selected word line and unselected word lines to a first word line voltage and a selected bit line and unselected bit lines to a first bit line voltage; and reading data from a memory cell connected to the selected word line and the selected bit line by changing the voltage of the selected word line from the first word line voltage to a second word line voltage and changing the voltage of the selected bit line from the first bit line voltage to a second bit line voltage after the precharging.

According to one aspect of the present invention, there is provided a non-volatile memory device including: a memory cell array including a plurality of word lines and bit lines that intersect each other and electrically rewritable memory cells that are arranged at intersections of the word lines and the bit lines and that respectively have variable resistive elements nonvolatily storing resistances as data; and a driving circuit that drives the plurality of word lines and bit lines, wherein for a data read operation, after precharging the word lines to a first word line voltage and the bit lines to a first bit line voltage prior to read operation, the driving circuit changes the voltage of a selected word line from the first word line voltage to a second word line voltage, and changes the voltage of a selected bit line from the first bit line voltage to a second bit line voltage to apply a read voltage required to read data from a selected memory cell.

According to one aspect of the present invention, there is provided a non-volatile memory device including: a memory cell array having a plurality of banks, the banks including a plurality of word lines and bit lines that intersect each other and electrically rewritable memory cells that are arranged at intersections of the word lines and the bit lines and that respectively have variable resistive elements nonvolatily storing resistances as data; and a driving circuit that selects one of the banks, from which data is read, from the memory cell array and that drives the plurality of word lines and bit lines of the selected bank, wherein for a data read operation, after precharging the word lines of the selected bank to a first word line voltage and the bit lines of the selected bank to a first bit line voltage prior to read operation, the driving circuit changes the voltage of a selected word line from the first word line voltage to a second word line voltage, and changes the voltage of a selected bit line from the first bit line voltage to a second bit line voltage to apply a read voltage required to read data from a selected memory cell.

DETAILED DESCRIPTION OF THE EMBODIMENTS

Hereinafter, exemplary embodiments of the invention will be described with reference to the accompanying drawings.

First Embodiment

Figure 1:
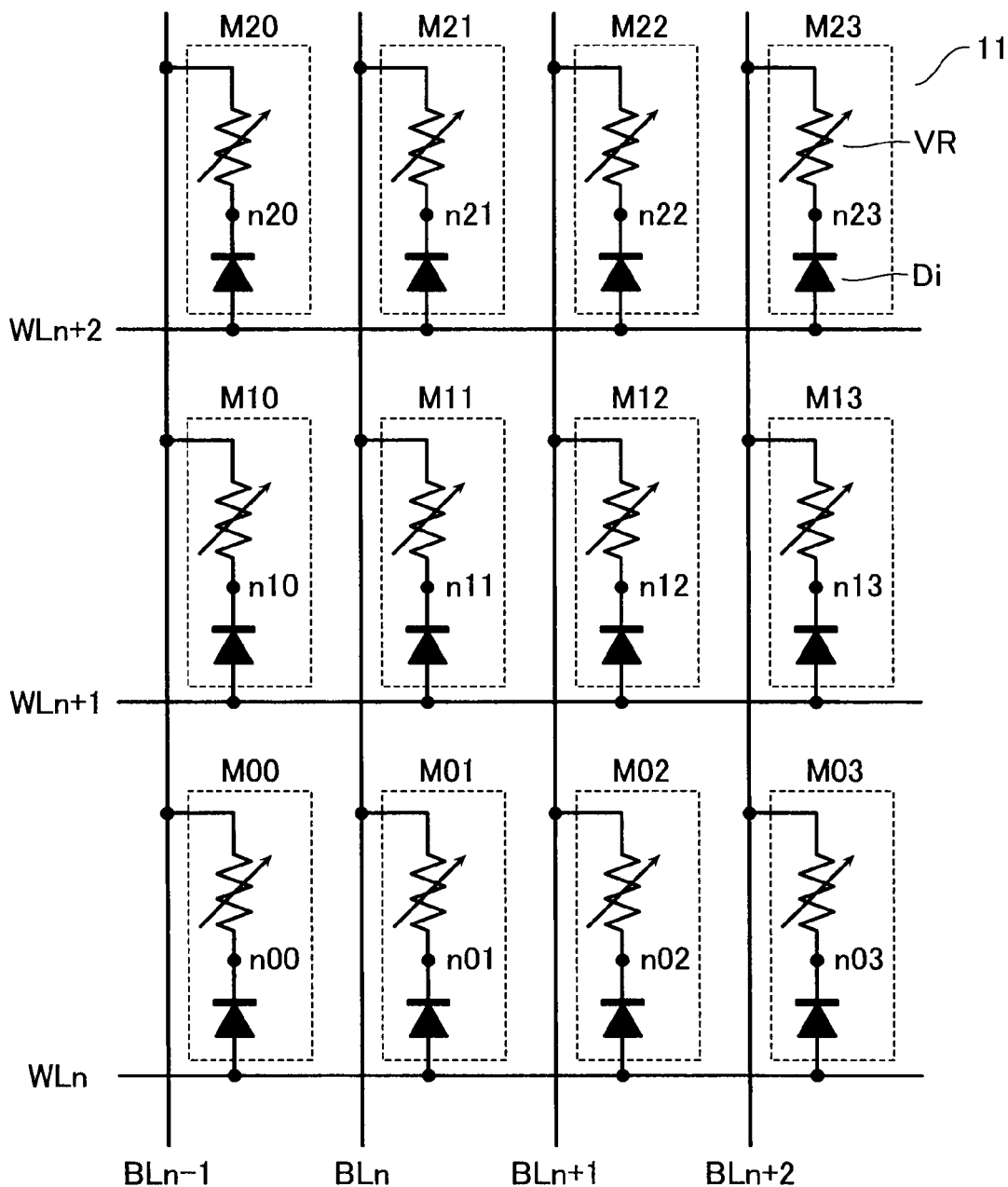
FIG. 1 is a view showing a cell array structure of a ReRAM according to a first embodiment of the invention.

FIG. 1 is a view showing a memory cell array structure of a non-volatile memory device according to an embodiment of the invention. In the figure, a memory cell array 11 is illustrated in a range of three memory cells in column direction and four memory cells in row direction, and word lines WL (WLn to WLn+2) arranged in row direction and bit lines BL (BLn−1 to BLn+2) arranged in a column direction are arranged, such that the word lines and the bit lines intersect each other. Non-volatile memory cells M (M00 to M23), each having a variable resistive element VR and a diode element Di, are arranged at the intersections of the word lines and the bit lines.

The diode element Di has an anode that is connected to a word line and a cathode that is arranged at a bit line side. A configuration, in which each of the variable resistive elements VR is connected between the cathode of the diode Di and the bit line, is shown. However, the connection relationship is not limited to that described above.

Figures 2A, 2B:
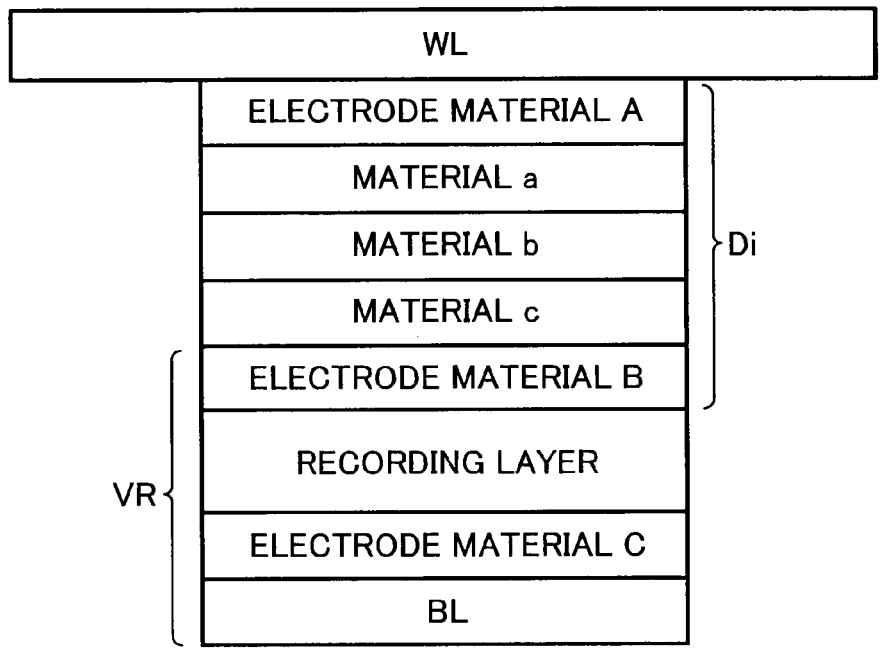
FIGS. 2A and 2B are views showing a cross-sectional structure of one cell of the cell array.

The memory cell may be formed to have a laminated cross-sectional structure illustrated in FIGS. 2A and 2B, for example. That is, the memory cell has a laminated structure of the diode Di and the variable resistive element VR interposed between the bit line BL and the word line WL. The variable resistive element VR is configured to have a recording layer made of a memory element material, for example, a transition metal oxide interposed between electrodes B and C. The diode Di is configured as a junction diode that includes a pin layer interposed between electrodes A and B (example 1), or as a so-called MIM diode that has a laminated structure of a metal layer, an insulating layer, and a metal layer interposed between the electrodes A and B (example 2).

Figure 3:
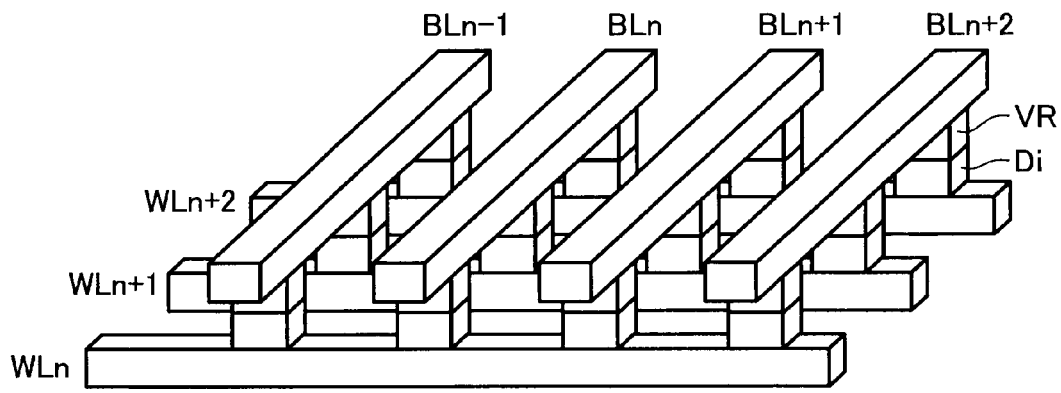
FIG. 3 is a view showing the three-dimensional structure of the cell array.

FIG. 3 is a view showing the three-dimensional structure of the memory cell array show in FIG. 1.

Figure 4:
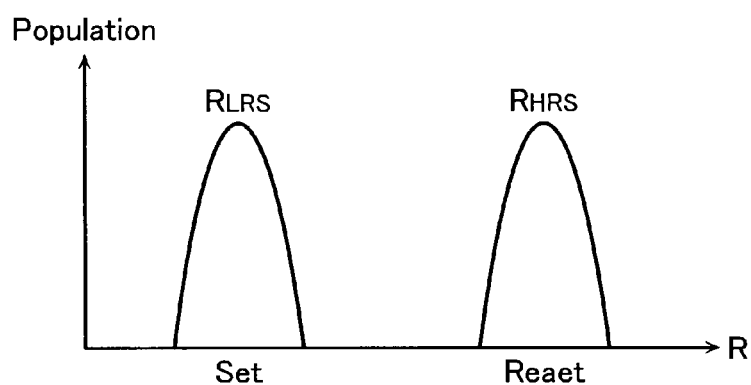
FIG. 4 is a view showing the distribution of resistances when binary data is stored.

In this embodiment, the memory cell M stores binary data defining a high-resistance state (HRS) as an erased state (for example, data "1") and a low-resistance state (LRS) as a written state (for example, data "0"). Here, a "0" write operation to change the state of the cell from the high-resistance state (HRS) to the low-resistance state (LRS) is defined as a write operation in a narrow sense (or set operation), and a "1" write operation to change the state of the cell from the low-resistance state (LRS) to the high-resistance state (HRS) is defined as an erase operation (or reset operation). FIG. 4 is a view showing an example of the distribution of data resistances.

Figure 5:
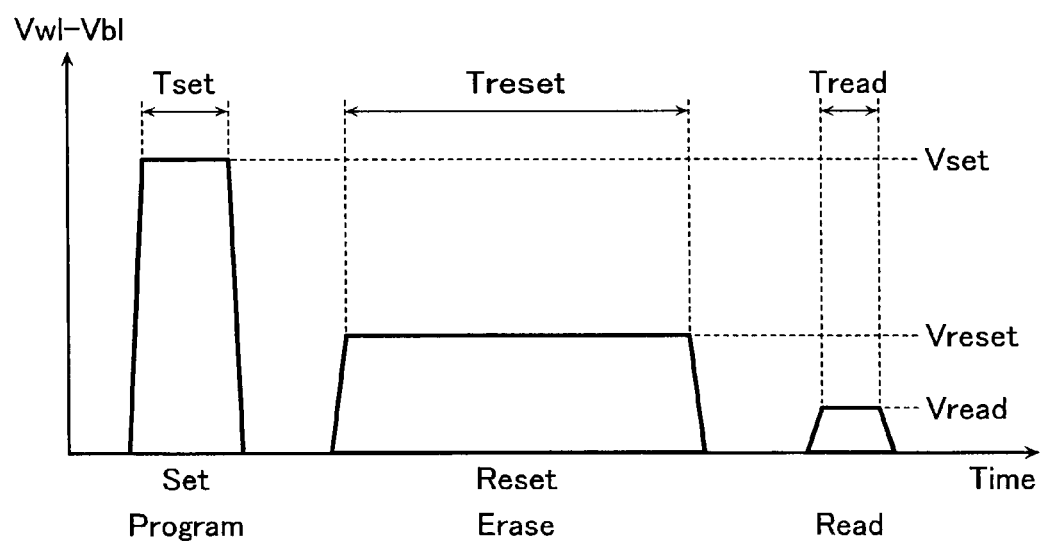
FIG. 5 is a view showing basic voltage waveforms for a set operation, a reset operation, and a read operation.

FIG. 5 is a view showing basic voltage waveforms for a set operation, a reset operation, and a read operation. The "0" write operation (set operation) to change the state of the cell from the high-resistance state (HRS) to the low-resistance state (LRS) is performed with "Vset" as a voltage of a selected memory cell (that is, a voltage between a selected word line and a selected bit line) and with "Tset" as a voltage applying time.

The "1" write operation (reset operation) to change the state of the cell from the low-resistance state (LRS) to the high-resistance state (HRS) is performed with "Vreset" as a voltage of a selected memory cell and with "Treset" as a voltage applying time.

In this case, the values are set to satisfy the following relationship: Treset>Tset; and Vset>Vreset. This results in that the set operation is performed as a voltage process, and the reset operation is performed as a thermal process by the Joule heat.

In order to read data from the memory cell, a voltage different from a set voltage or a reset voltage, specifically, a read voltage Vread that is lower than set voltage Vset and the reset voltage Vreset and of a short pulse width is used so as to read a cell current without changing the state of the cell. It should be noted that, the set voltage Vset, the reset voltage Vreset, and the read voltage Vread are higher than the forward voltage of the diode Di.

Next, the detailed write operation in specific embodiments of the invention will be described.

As described above, in a ReRAM, a voltage of a short pulse width (several tens of nanoseconds, for example) is applied to perform a read operation. In this case, the storage state of the memory cell is determined by applying voltage to provide a potential difference at least to cause the diode element connected between a selected word line and a selected bit line to be forward biased and to allow a current required for the read operation to flow, and then detecting whether the amount of flowing cell current is large or small depending on the resistance of the resistive element.

Figure 6:
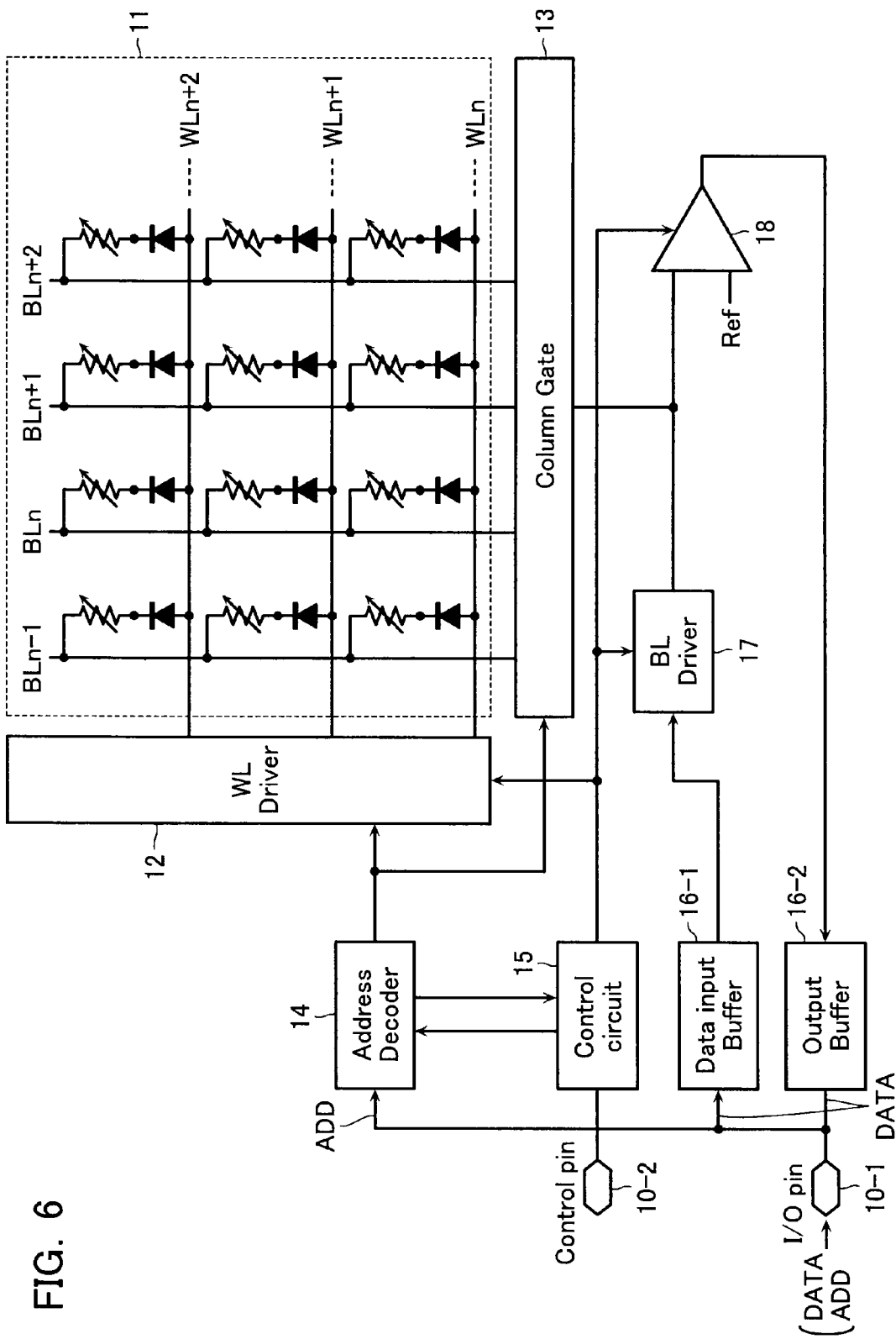
FIG. 6 is a view showing a block diagram of the ReRAM according to the first embodiment.

FIG. 6 is a view showing an example of a block diagram of the ReRAM. A word line driver 12 selects and drives a word line of the memory cell array 11 corresponding to an input address. A column gate 13 performs switching between a selected bit line and an unselected bit line according to an input address.

An I/O pin 10-1 is a pin for inputting/outputting data DATA, and also serves as a pin for inputting an address ADD. An address decoder 14 is provided to interpret address data input through the I/O pin 10-1, divide the address data into a row address and a column address, or a block address if needed, and decode the addresses. A control circuit 15 receives control signals (a chip enable signal /CE and an output enable signal /OEx, for example) from a host device through a control pin 10-2 to control the operation of a device.

A data input buffer 16-1 is provided to hold and interpret write data received through the I/O pin 10-1, and an output buffer 16-2 is provided to output data read from the memory cell array to the outside of the device. A bit line driver 17 supplies a voltage required for a write (set) operation, an erase (reset) operation, and a read operation to a sense amplifier 18. The sense amplifier 18 compares read data with a reference potential Ref to detect an analog voltage, and converts the analog voltage into binary data.

Figure 7:
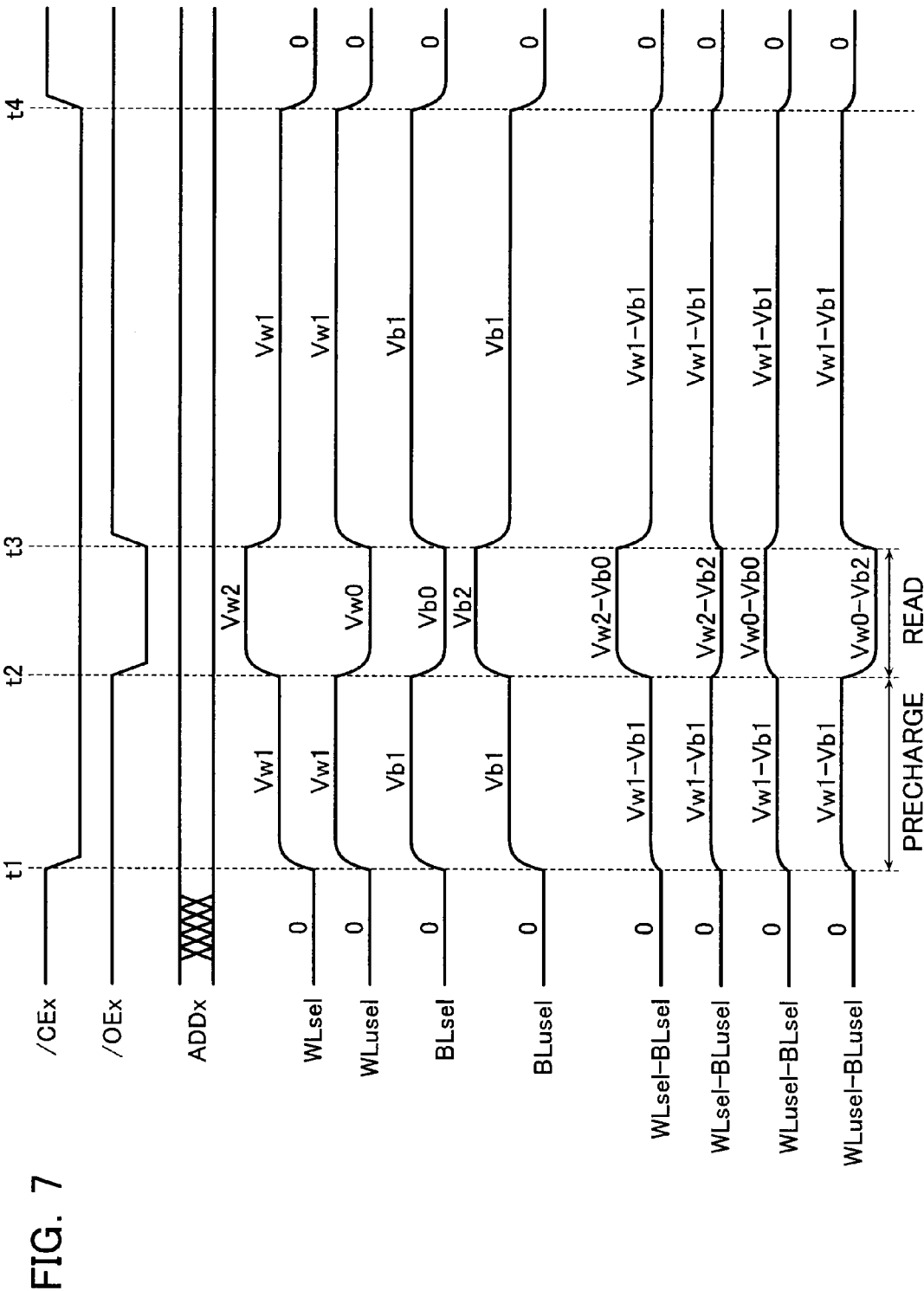
FIG. 7 is a view showing waveforms for read operation from the ReRAM according to the first embodiment.

FIG. 7 is a view showing waveforms for read operation. WLsel indicates a selected word line for read, WLusel indicates an unselected word line for read, BLsel indicates a selected bit line for read, and BLusel indicates an unselected bit line for read.

In this embodiment, a positive voltage Vw2 applied to the selected word line WLsel during a read operation period (t2-t3) is a read voltage. Specifically, when the voltage Vb0 of the selected bit line BLsel is set to 0 V or a small value approximate to 0 V, then a voltage Vw2−Vb0 between the selected word line WLsel and the selected bit line BLseL is a read voltage applied to the selected memory cell.

On the other hand, a positive voltage Vb2 applied to the unselected bit line BLusel during a read operation period is a blocking voltage that prevents the read voltage applied to the selected word line WLsel from being applied to an unselected cell connected to the unselected bit line. When the blocking voltage Vb2 is set approximate to Vw2, then the voltage applied to the unselected memory cell is any one of the voltages Vw2−Vb2, Vw0−Vb2, and Vw0−Vb0, and the diode is reverse biased or has a sufficiently low voltage not to rise even if the diode is forward biased.

In this embodiment, when the device is activated, a pre-charge period t1-t2 is provided prior to the read operation period t2-t3 in order to charge the word lines and the bit lines respectively to the read voltage Vw2 or to a positive intermediate voltage Vw1 and Vb1 that is lower than the blocking voltage during the precharge period t1-t2. Specifically, for example, the intermediate voltages Vw1 and Vb1 have the same or similar value.

To describe specifically, the ReRAM has a control signal chip enable /CE pin in order to set the device in a standby state (sleep state). When /CE=H level (prior to the time t1), the operational states of the other control pins (for example, the output signal enable /OEx pin) are not recognized even if they are operated. In addition, if an internal voltage boosting or lowering circuit is provided in order to reduce the amount of current consumed by the device, the operation thereof is minimized.

In this state, all of the selected word line for read WLsel, the unselected word lines for read WLusel, the selected bit line for read BLsel, and the unselected bit lines for read BLusel are maintained substantially at a voltage Vss (=0 V) to be matched with the standby state.

In this state, the chip enable (/CE) pin is set to L level so as to change the ReRAM from the standby state to an active state (time t1). The control circuit 15 inside the device detects the state change and then controls to set all the word lines to a positive voltage Vw1 and all the bit lines to a positive voltage Vb1. The voltage Vw1 is lower than the read voltage Vw2 applied to the selected word line WLsel, and the voltage Vb1 is lower than the blocking voltage Vb2 applied to the unselected bit line BLusel. Therefore, a voltage necessary to read is not applied even to the selected memory cell at this stage.

Then, the voltage of the output enable signal (/OEx) pin is changed from H level to L level while a read address is set, so as to start a read operation (time t2), and read data is output to the I/O pin 10-1 in a predetermined amount of time.

As shown in FIG. 7, during the read operation (t2-t3), the voltage applied to the selected word line WLsel is changed from the voltage Vw1 to the voltage Vw2 that is higher than the voltage Vw1, and the voltage applied to the unselected word lines WLusel is changed from the voltage Vw1 to the voltage Vw0 (0 V, for example) that is lower than the voltage Vw1. Also, the voltage of the selected bit line BLsel is changed from the voltage Vb1 to the voltage Vb0 (0 V, for example) that is lower than the voltage Vb1, and the voltage of the unselected bit lines BLusel is changed from the voltage Vb1 to the voltage Vb2 that is higher than the voltage Vb1.

If the voltages are in relationship Vw2>Vw0, the voltages keep satisfying the relationship Vw2>Vw1>Vw0>0 V. If voltages are in relationship Vb2>Vb0, the voltages keep satisfying the relationship Vb2>Vb1>Vb0>0 V. Accordingly, a read voltage necessary to read is applied only to the selected memory cell, and the diodes are not forward biased or reverse biased in the unselected memory cells.

To more specifically describe, in the memory cell array, there are two kinds of word lines, that is, a selected word line and unselected word lines in the row direction, and there are two kinds of bit lines, that is, a selected bit line and unselected bit lines in the column direction. Therefore, there are four combinations of potential relationship. To a memory cell connected to the selected word line WLsel and the selected bit line BLsel, a read voltage Vw2−Vb0 required to forward bias the diode sufficiently is applied.

Meanwhile, to a memory cell connected to the selected word line WLsel and the unselected bit line BLusel, a voltage Vw2−Vb2 is applied. That is, the positive voltage Vb2 of the unselected bit line serves to block a positive voltage Vw2 forward biasing a diode of an unselected memory cell, and the voltage Vw2−Vb2 has a low value.

To a memory cell connected to the unselected word line WLusel and the selected bit line BLsel, a low voltage Vw0−Vw0 is applied, and to an unselected memory cell connected to the unselected word line WLusel and the unselected bit line BLusel, a voltage Vw0−Vb2 causing the diode to be reverse biased is applied. The voltage Vw1−Vb1 may be 0 V.

At a time t3, the read operation ends (/OEx=H), and the same potential relationship as that after the time t1 is established to prepare for the next read operation (time t3-t4).

At the time t4, all the read operation ends, and the device is returned from the active state to the standby state. That is, all of the bit lines and the word lines are set to 0 V to suppress current consumption.

Even conventionally, the voltage applied to the word line and the bit line during the read operation is lower than the write (set) voltage and the erase (reset) voltage. However, as the capacity or resistance of the word line or the bit line is increased or their physical lengths are increased with an increase in the capacity of a memory device, a transition time required for charge or discharge is increased, which deteriorates a read performance.

In this embodiment, a voltage applied between both ends of a memory cell is the same as that in the conventional technique, however this embodiment is characterized in that the absolute potentials of the both ends are different from each other. That is, in this embodiment, when the device is in an active state, and before a read operation, the word line is precharged to the intermediate voltage Vw1 and the bit line is also precharged to the intermediate voltage Vb1. Accordingly, a voltage amplitude to the read voltage Vw2 that is to be applied to the selected word line later is reduced, and also a voltage amplitude to the read blocking voltage Vb2 that is to be applied to for the unselected bit line later is reduced.

As described above, even when the capacity, resistance, or physical length of the word line or the bit line are increased, it is possible to perform a read operation in a short time without changing a voltage applied to the memory cell. Also, it is possible to prevent an unexpected potential difference due to charge speed difference when the capacities, resistances, and physical lengths are significantly different between the word lines from each other or between the bit lines from each other. As a result, it is possible to prevent a false read (false set) and an false erase (false reset) associated with a read operation.

Second Embodiment

Figure 8:
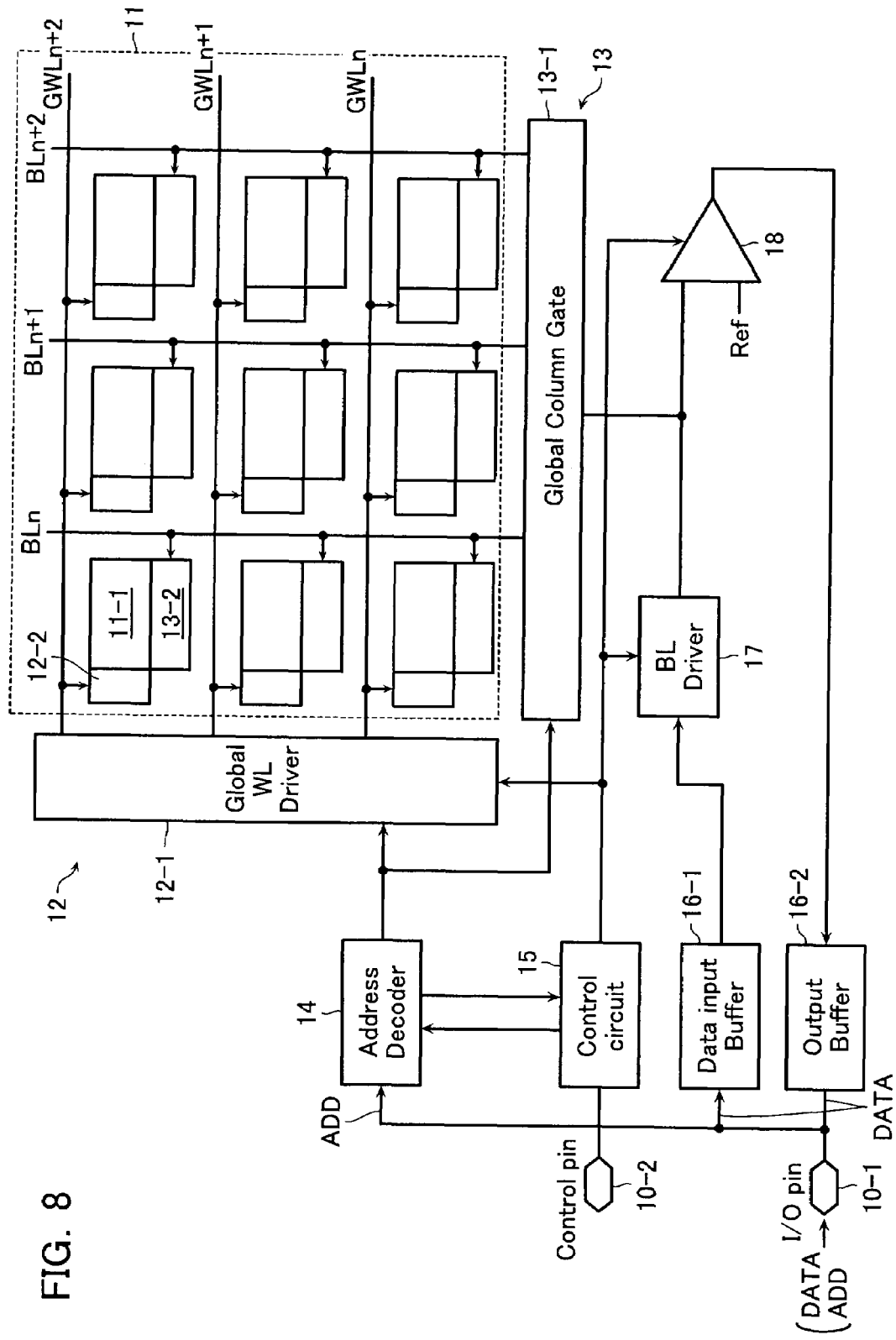
FIG. 8 is a view showing a block diagram of a ReRAM according to a second embodiment.

FIG. 8 is a view showing a block diagram of a ReRAM according to a second embodiment, which is a modification of the first embodiment. In the second embodiment, a memory cell array 11 is divided into a plurality of banks 11-1 (nine banks in FIG. 8). A word line driver 12 includes a global word line driver 12-1 and local word line drivers 12-2 adjunct to the banks 11-1. Similarly, a column gate 13 includes a global column gate 13-1 and local column gates 13-2 adjunct to the banks 11-1.

The other components are same as those according to the first embodiment.

In the second embodiment, given that a bank address is set when the state of a memory device is changed from a standby state to an active state, an operation of precharging the word line and the bit line to an intermediate potential is necessary only for the bank from which data will be read, and the precharge is not necessary for remaining unselected banks. Therefore, it is possible to prevent an unnecessary charge/discharge operation.

Figure 9:
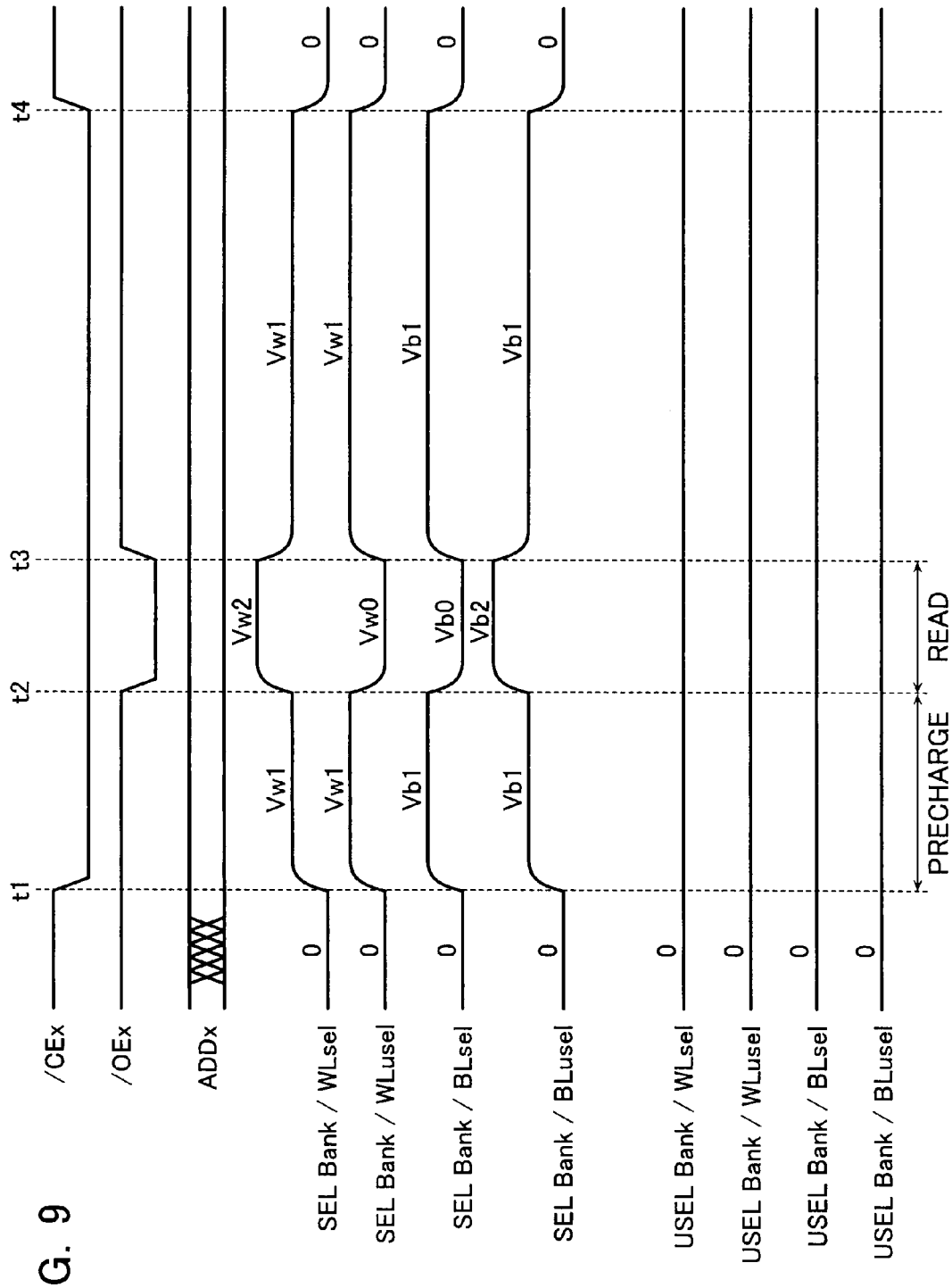
FIG. 9 is a view showing waveforms for read operation from the ReRAM according to the second embodiment.

FIG. 9 is a view showing waveforms for read operation according to the second embodiment corresponding the FIG. 7 of the first embodiment. In a selected bank, a selected word line for read is indicated as SEL Bank/WLsel, an unselected word line for read is indicated as SEL Bank/WLusel, a selected bit line for read is indicated as SEL Bank/BLsel, and an unselected bit line for read is indicated as SEL Bank/BLusel. Also, in an unselected bank, a selected word line for read is indicated as USEL Bank/WLsel, an unselected word line for read is indicated as USEL Bank/WLusel, a selected bit line for read is indicated as USEL Bank/BLsel, and an unselected bit line for read is indicated as USEL Bank/BLusel.

The waveforms for read operation of the selected bank are the same as those in the first embodiment. The unselected bank is kept in a standby state without precharge performed starting from t1 and without applying voltage to the selected word line, unselected word lines, selected bit line, and unselected bit lines performed at t2.

According to the second embodiment, since the banks not related to a read operation are not unnecessary precharged, it is possible to reduce the amount of current consumed by the precharge operation. In addition, it is possible to effectively reduce the load capacity of the word lines and the bit lines, whereby it is possible to further increase the operation speed of a memory device.

Third Embodiment

Figure 10:
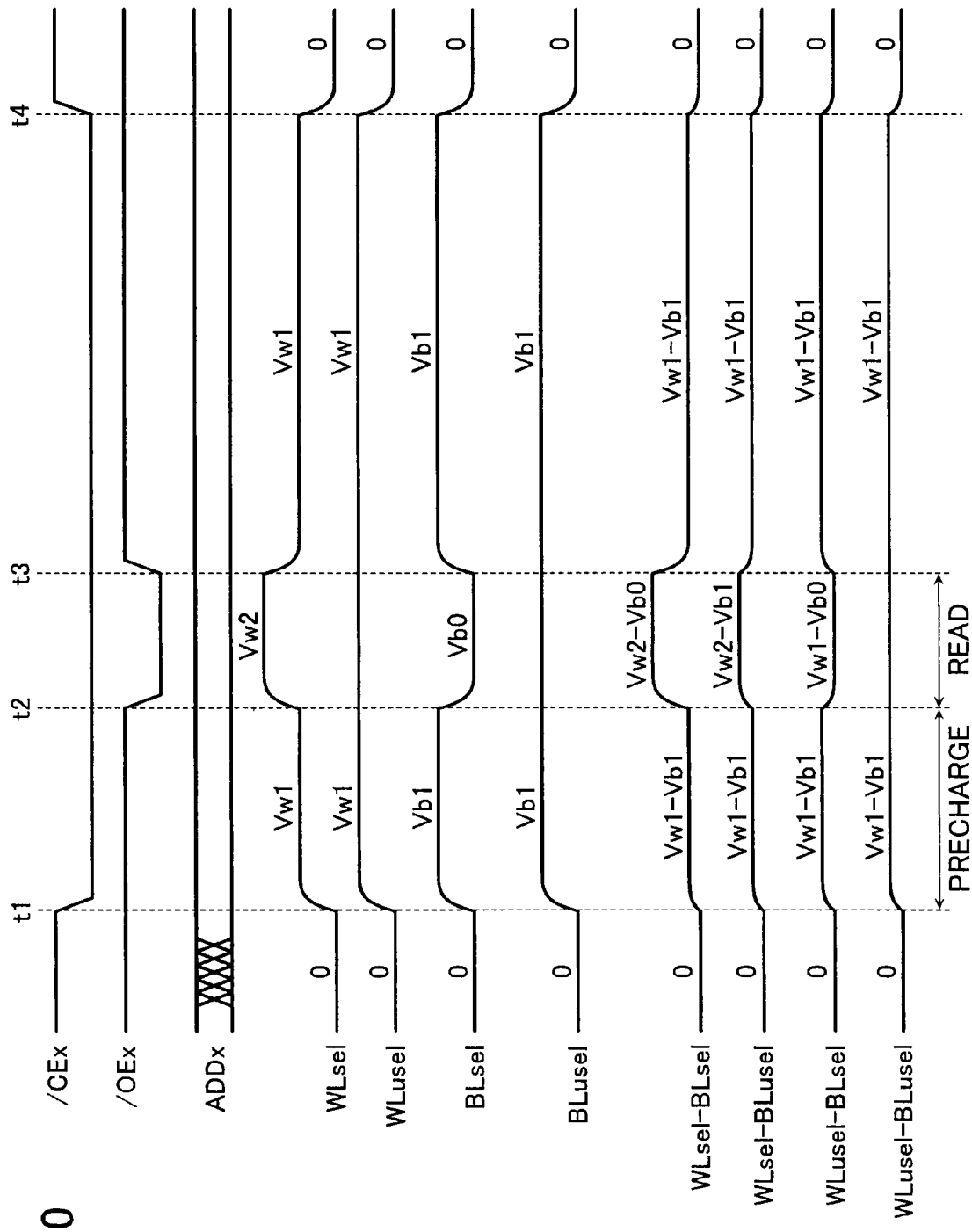
FIG. 10 is a view showing waveforms for read operation from a ReRAM according to a third embodiment.

FIG. 10 is a view showing waveforms for read operation according to a third embodiment, which is a modification of the first embodiment, corresponding to FIG. 7.

In the first embodiment, a charge or discharge operation is performed on all of the selected word line, the unselected word lines, the selected bit line, and the unselected bit lines during the read operation period (t2-t3).

However, in a memory cell in which a diode element is connected in series to a variable resistive element, no cell current flows with a voltage lower than a forward voltage drop Vf of the diode (for example, Vf=0.6 V). Therefore, in the memory cells other than the memory cell connected to the selected word line and the selected bit line in FIG. 7, a part of the charge or discharge operation may be eliminated as long as the voltages of the unselected cells is secured to be lower than the forward voltage drop of the diode during the read operation period t2-t3.

Specifically, in FIG. 10, the read operation is performed without changing the voltage of the unselected word line WLusel from a precharge voltage (Vw1) and without changing the voltage of the unselected bit line BLusel from a precharge voltage (Vb1).

That is, in FIG. 10, the diode blocks a cell current in the range in which a voltage Vw2–Vb1 and a voltage Vw1–Vb0 are lower than the voltage Vf. Therefore, it is possible to keep the unselected word lines and the unselected bit lines at precharged potentials and an operation of charging or discharging thereof can be eliminated. Accordingly, it is possible to prevent unnecessary level transition and thus further improve the operation speed of a memory device.

In FIG. 10, both the discharge of the unselected word lines and the charge of the unselected bit lines are eliminated during the period t2-t3. However, only one of the discharge of the unselected word lines and the charge of the unselected bit lines may be eliminated depending on the voltages between both ends of the unselected cells.

Fourth Embodiment

In the first to third embodiments, during the read operation of the ReRAM, the read address is specified through the I/O pin 10-1. However, it is considered that the operation of setting the input of an address, changing the output enable signal (/OEx) to L level, and then outputting data could be a barrier for the high speed operation.

Figure 11:
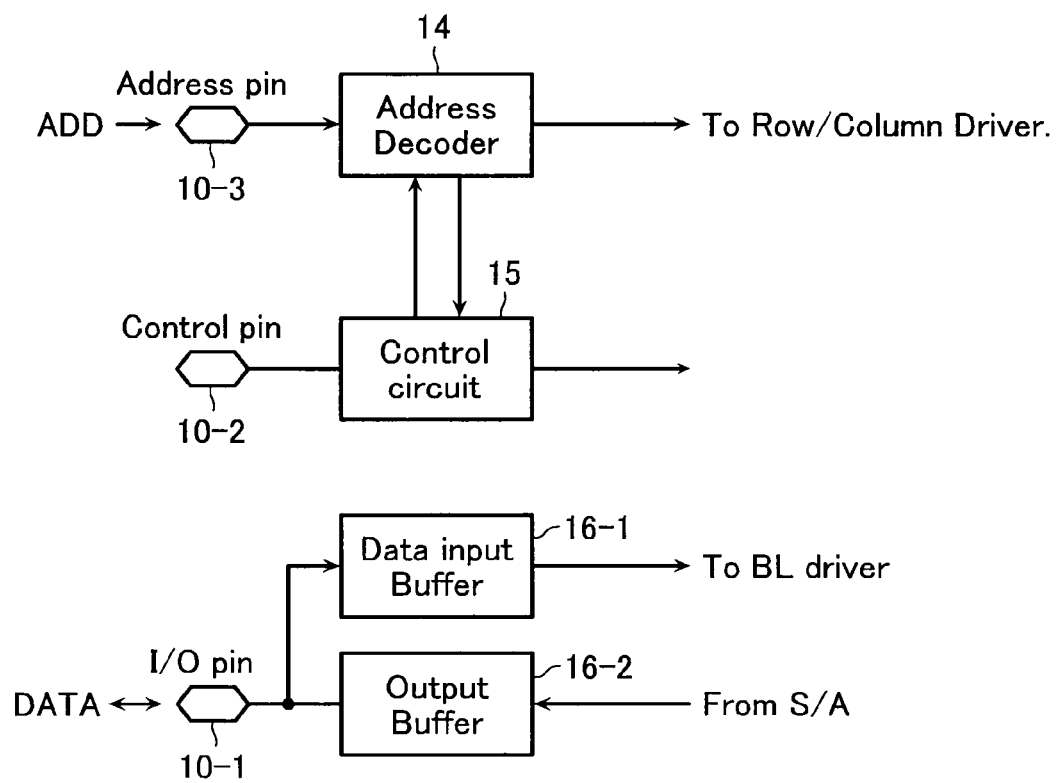
FIG. 11 is view showing a configuration of data, address, and a control signal input unit of a ReRAM according to a fourth embodiment.

Whereas, it is effective to provide an address pin (ADDX) 10-3 for inputting an address ADD independently from the input/output pin (IOx) 10-1. FIG. 11 only shows an address decoder 14, a control circuit 15, an input buffer 16-1, and an output buffer 16-2. Other than that, the configuration is the same as each of the above-mentioned embodiments.

Fifth Embodiment

Figure 12:
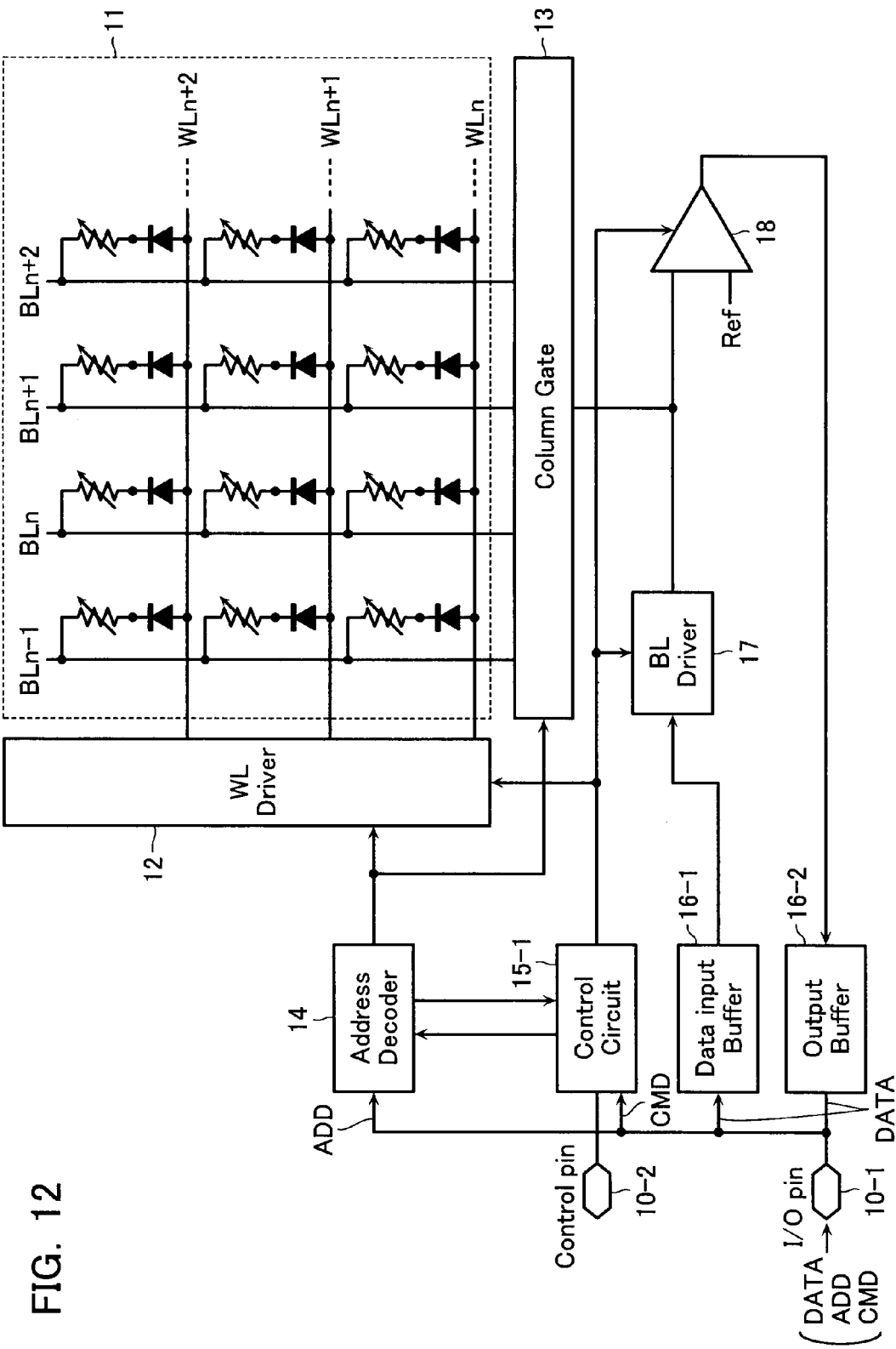
FIG. 12 is a view showing a block diagram of a ReRAM according to a fifth embodiment.

FIG. 12 is a view showing a block diagram of a ReRAM according to an embodiment in which the ReRAM is controlled in response to input of a command, which is a modification of the first embodiment, the figure being correspond to FIG. 6. A command CMD transmitted through the input/output pin 10-1 is input to a control circuit 15-1 in addition to various kinds of control signals (for example, a chip enable signal /CEx, a write enable signal /WEx, and an output enable signal /OEx). The control circuit 15-1 decodes the command CMD for an operation control. Other than that, the configuration is the same as the first embodiment.

The command CMD is input together with the write enable signal /WEx, which is an external control signal, and is decoded by the control circuit 15-1. During a read operation, the control circuit 15-1 interprets a read start command to generate an internal signal required for the read operation and the timing thereof, for example. Specifically, the control circuit 15-1 controls the word line driver 12, the column gate 13 and the like, for example.

Figure 13:
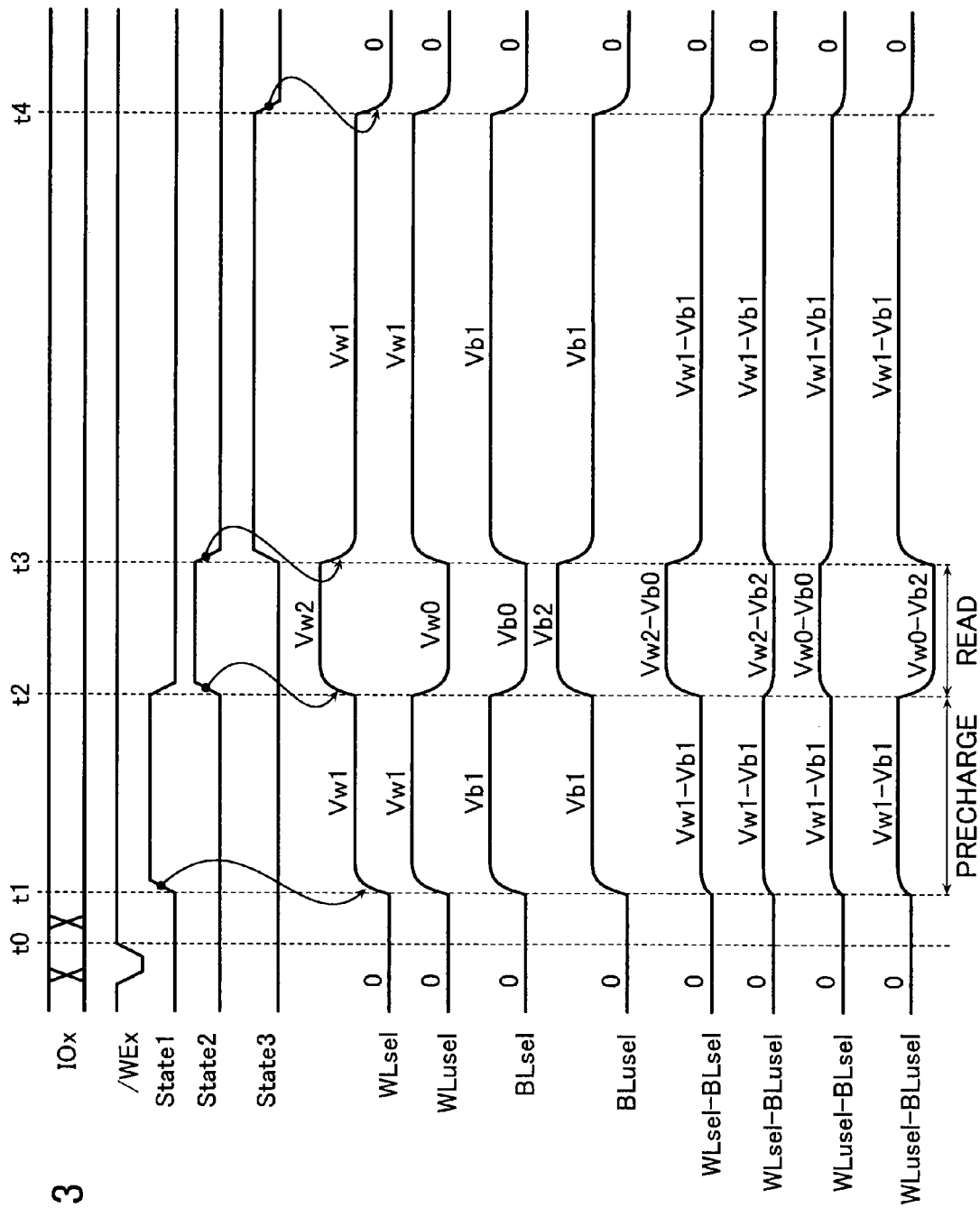
FIG. 13 is a view showing waveforms for read operation from the ReRAM according to the fifth embodiment.

FIG. 13 is a view showing waveforms for read operation according to the fifth embodiment.

When the write enable signal /WEx is toggled (time t0), a read operation starts. Based on the command that is input together with the write enable signal /WEx, the control circuit 15-1 activates an internal signal State1 (time t1), notifies that a precharge operation starts, and then the word lines and the bit lines are precharged to the voltages Vw1 and Vb1 respectively.

After a predetermined time has elapsed, at a time t2, the control circuit 15-1 deactivates the internal signal State1, activates an internal signal State2 to notify that the read operation starts, and then the voltages of the selected word line, the unselected word lines, the selected bit line, and the unselected bit lines are changes to Vw2, Vw0, Vb0, and Vb2 respectively.

After a predetermined time has elapsed, at a time t3, the control circuit 15-1 deactivates the internal signal State2, and activates an internal signal State3 to perform a post-process required to operate memory cells. The post-process may be such as a transmission of data sensed by the sense amplifier 18 to the output buffer 16-2, which is not shown in the figure.

After a predetermined time has elapsed, at a time t4, the control circuit 15-1 deactivates the internal signal State3. This is the end of a command operation related to a series of read operation. If necessary, although not shown in the figure, the control circuit 15-1 may transmit a notice indicating that an internal process ends to the outside of the device.

The only difference between the fifth embodiment and the first embodiment is how the internal operation is started, that is, whether it is started with a signal level change of a control pin provided outside of a device as a trigger or it is started at a predetermined timing. Other than that, the way of read operation of a memory cell is the same as the first embodiment.

The fifth embodiment can be similarly applied to the second to fourth embodiments.

For a memory cell including a diode having an anode connected to the bit line, the voltages satisfy the relationship $Vw2<Vw1<Vw0$ and $Vb2<Vb1<Vb0$, for example, where the first, second, and third word line voltages are $Vw1$, $Vw2$, and $Vw0$ and the first, second, and third bit line voltages are $Vb1$, $Vb0$, and $Vb2$, respectively. In this case, a voltage is applied to a selected memory cell as a read voltage to forward bias the diode, and a voltage $Vb2-Vw2$, $Vb0-Vw0$ or $Vb2-Vw0$ is applied to an unselected memory cell as a voltage to reverse bias the diode or a voltage that is lower than the threshold voltage of the diode.

What is claimed is:

1. A method of reading data from a non-volatile memory device including word lines and bit lines that intersect each other and electrically rewritable memory cells that are arranged at intersections of the word lines and the bit lines and that respectively have variable resistive elements nonvolatily storing resistances as data, the method comprising:
    precharging a selected word line and unselected word lines to a first word line voltage and a selected bit line and unselected bit lines to a first bit line voltage; and
    reading data from a memory cell connected to the selected word line and the selected bit line by changing the voltage of the selected word line from the first word line voltage to a second word line voltage and changing the voltage of the selected bit line from the first bit line voltage to a second bit line voltage after the precharging.

2. The method of reading data from a non-volatile memory device according to claim 1, wherein
    in the reading data after the precharging, the voltage of each of the unselected word lines is changed from the first word line voltage to a third word line voltage, and the voltage of each of the unselected bit lines is changed from the first bit line voltage to a third bit line voltage.

3. The method of reading data from a non-volatile memory device according to claim 1, wherein
    in the reading data after the precharging, at least one of the first word line voltage for the unselected word lines and the first bit line voltage for the unselected bit lines is maintained as is.

4. The method of reading data from a non-volatile memory device according to claim 1, wherein
    $Vw1$ is substantially equal to $Vb1$, where the first word line voltage is $Vw1$ and the first bit line voltage is $Vb1$.

5. The method of reading data from a non-volatile memory device according to claim 4, wherein
    each of the memory cells includes a diode connected in series to the variable resistive element of the memory cell, the diode having an anode connected to one of the word lines,
    the voltages satisfy the relationship $Vw2>Vw1$ and $Vb1>Vb0$, and a voltage $Vw2-Vb0$ is applied to the selected memory cell as a read voltage to forward bias the diode, where the second word line voltage is $Vw2$ and the second bit line voltage is $Vb0$.

6. The method of reading data from a non-volatile memory device according to claim 5, wherein
    the voltages satisfy the relationship $Vw2>Vw1>Vw0$ and $Vb2>Vb1>Vb0$, and a voltage $Vw0-Vb2$, $Vw2-Vb2$, or $Vw0-Vb0$ is applied to each of unselected memory cells as a voltage to reverse bias the diode or a voltage that is lower than a threshold voltage of the diode, where the third word line voltage is $Vw0$ and the third bit line voltage is $Vb2$.

7. The method of reading data from a non-volatile memory device according to claim 4, wherein
    each of the memory cells includes a diode connected in series to the variable resistive element of the memory cell, the diode having an anode connected to one of the bit lines,
    the voltages satisfy the relationship $Vw2<Vw1$ and $Vb1<Vb0$, and a voltage $Vb0-Vw2$ is applied to the selected memory cell as a read voltage to forward bias the diode, where the second word line voltage is $Vw2$ and the second bit line voltage is $Vb0$.

8. The method of reading data from a non-volatile memory device according to claim 7, wherein
    the voltages satisfy the relationship $Vw2<Vw1<Vw0$ and $Vb2<Vb1<Vb0$, and a voltage $Vb2-Vw0$, $Vb2-Vw2$, or $Vb0-Vw0$ is applied to each of the unselected memory cells as a voltage to reverse bias the diode or a voltage that is lower than a threshold voltage of the diode, where the third word line voltage is $Vw0$ and the third bit line voltage is $Vb2$.

9. A non-volatile memory device comprising:
    a memory cell array including a plurality of word lines and bit lines that intersect each other and electrically rewritable memory cells that are arranged at intersections of the word lines and the bit lines and that respectively have variable resistive elements nonvolatily storing resistances as data; and
    a driving circuit that drives the plurality of word lines and bit lines, wherein
    for a data read operation, after precharging the word lines to a first word line voltage and the bit lines to a first bit line voltage prior to read operation, the driving circuit changes the voltage of a selected word line from the first word line voltage to a second word line voltage, and changes the voltage of a selected bit line from the first bit line voltage to a second bit line voltage to apply a read voltage required to read data from a selected memory cell.

10. The non-volatile memory device according to claim 9, wherein
    when reading data after the precharging, the driving circuit changes the voltage of each of unselected word lines from the first word line voltage to a third word line voltage, and changes the voltage of each of unselected bit lines from the first bit line voltage to a third bit line voltage.

11. The non-volatile memory device according to claim 9, wherein
    when reading data after the precharging, the driving circuit maintains at least one of the first word line voltage for the unselected word lines and the first bit line voltage for the unselected bit lines as is.

12. The non-volatile memory device according to claim 9, wherein
    the driving circuit sets the voltages such that $Vw1$ is substantially equal to $Vb1$, where the first word line voltage is $Vw1$ and the first bit line voltage is $Vb1$.

13. The non-volatile memory device according to claim 12, wherein
    each of the memory cells includes a diode connected in series to the variable resistive element of the memory cell, the diode having an anode connected to one of the word lines,
    the driving circuit sets the voltages so as to satisfy the relationship $Vw2>Vw1$ and $Vb1>Vb0$, and applies a voltage $Vw2-Vb0$ to the selected memory cell as a read voltage to forward bias the diode, where the second word line voltage is $Vw2$ and the second bit line voltage is $Vb0$.

14. The non-volatile memory device according to claim 13, wherein
the driving circuit sets the voltages so as to satisfy the relationship $Vw2>Vw1>Vw0$ and $Vb2>Vb1>Vb0$, and applies a voltage $Vw0-Vb2$, $Vw2-Vb2$, or $Vw0-Vb0$ to each of unselected memory cells as a voltage to reverse bias the diode or a voltage that is lower than a threshold voltage of the diode, where the third word line voltage is $Vw0$ and the third bit line voltage is $Vb2$.

15. The non-volatile memory device according to claim 12, wherein
each of the memory cells includes a diode connected in series to the variable resistive element of the memory cell, the diode having an anode connected to one of the bit lines,
the driving circuit sets the voltages so as to satisfy the relationship $Vw2<Vw1$ and $Vb1<Vb0$, and applies a voltage $Vb0-Vw2$ to the selected memory cell as a read voltage to forward bias the diode, where the second word line voltage is $Vw2$ and the second bit line voltage is $Vb0$.

16. The non-volatile memory device according to claim 15, wherein
the driving circuit sets the voltages so as to satisfy the relationship $Vw2<Vw1<Vw0$ and $Vb2<Vb1<Vb0$, and applies a voltage $Vb2-Vw0$, $Vb2-Vw2$, or $Vb0-Vw0$ to each of the unselected memory cells as a voltage to reverse bias the diode or a voltage that is lower than a threshold voltage of the diode, where the third word line voltage is $Vw0$ and the third bit line voltage is $Vb2$.

17. A non-volatile memory device comprising:
a memory cell array having a plurality of banks, the banks including a plurality of word lines and bit lines that intersect each other and electrically rewritable memory cells that are arranged at intersections of the word lines and the bit lines and that respectively have variable resistive elements nonvolatily storing resistances as data; and
a driving circuit that selects one of the banks, from which data is read, from the memory cell array and that drives the plurality of word lines and bit lines of the selected bank, wherein
for a data read operation, after precharging the word lines of the selected bank to a first word line voltage and the bit lines of the selected bank to a first bit line voltage prior to read operation, the driving circuit changes the voltage of a selected word line from the first word line voltage to a second word line voltage, and changes the voltage of a selected bit line from the first bit line voltage to a second bit line voltage to apply a read voltage required to read data from a selected memory cell.

18. The non-volatile memory device according to claim 17, wherein
in the bank, form which data is read, when reading data after the precharging, the driving circuit changes the voltage of each of unselected word lines from the first word line voltage to a third word line voltage, and changes the voltage of each of unselected bit lines from the first bit line voltage to a third bit line voltage.

19. The non-volatile memory device according to claim 17, wherein
in the bank, form which data is read, when reading data after the precharging, the driving circuit maintains at least one of the first word line voltage for the unselected word lines and the first bit line voltage for the unselected bit lines as is.

20. The non-volatile memory device according to claim 17, wherein
the driving circuit sets the voltages such that $Vw1$ is substantially equal to $Vb1$, where the first word line voltage is $Vw1$ and the first bit line voltage is $Vb1$.

* * * * *